(12) United States Patent
Yongzhong et al.

(10) Patent No.: US 11,125,631 B2
(45) Date of Patent: Sep. 21, 2021

(54) PIEZOELECTRIC SENSOR HAVING AN INVERTED CONICAL BASE STRUCTURE

(71) Applicant: FATRI United Testing & Control (Quanzhou) Technologies Co., Ltd., Quanzhou (CN)

(72) Inventors: Nie Yongzhong, Quanzhong (CN); Nie Chuan, Quanzhou (CN); Zeng Tingfang, Quanzhou (CN)

(73) Assignee: FATRI United Testing & Control (Quanzhou) Technologies Co. Ltd., Quanzhou (CN)

( * ) Notice: Subject to any disclaimer, the term of this patent is extended or adjusted under 35 U.S.C. 154(b) by 161 days.

(21) Appl. No.: 16/517,781

(22) Filed: Jul. 22, 2019

(65) Prior Publication Data
US 2020/0096399 A1 Mar. 26, 2020

(30) Foreign Application Priority Data
Sep. 20, 2018 (CN) .......................... 201821544161.7

(51) Int. Cl.
*G01L 1/16* (2006.01)
*H01L 41/113* (2006.01)
(52) U.S. Cl.
CPC ............ *G01L 1/16* (2013.01); *H01L 41/1132* (2013.01)
(58) Field of Classification Search
CPC ....... G01L 1/16; G01P 15/09; G01C 19/5607; H01L 41/1132

USPC ..................................................... 73/514.34
See application file for complete search history.

(56) References Cited

U.S. PATENT DOCUMENTS

| | | | | |
|---|---|---|---|---|
| 3,374,663 A | * | 3/1968 | Morris | G01L 1/16 73/654 |
| 4,163,206 A | * | 7/1979 | Hall, Jr. | G01V 1/189 310/331 |
| 4,461,177 A | * | 7/1984 | Feng | G01H 11/08 73/587 |
| 7,637,161 B2 | * | 12/2009 | Vornbrock | G01N 29/24 181/102 |
| 9,771,150 B2 | * | 9/2017 | Smith | F16F 7/1034 |
| 2020/0379003 A1 | * | 12/2020 | Nie | G01P 15/0922 |

FOREIGN PATENT DOCUMENTS

| CN | 206848489 | * | 1/2018 |
|---|---|---|---|
| CN | 208621173 | * | 3/2019 |

* cited by examiner

*Primary Examiner* — Octavia Hollington
(74) *Attorney, Agent, or Firm* — Amster, Rothstein & Ebenstein LLP

(57) ABSTRACT

The present application provides a piezoelectric sensor, comprising: a base member, having an inverted conical structure at one end; a piezoelectric sensing element, disposed at the other end of the base member; a mass block, disposed on the piezoelectric sensing element; a charge amplifier, disposed above the mass block and electrically connected to the piezoelectric sensing element. The process of installing the piezoelectric sensor provided in the technical solution of the present application on the ground is simple and fast, and its low-frequency response sensitivity is high.

8 Claims, 2 Drawing Sheets

PIEZOELECTRIC SENSOR HAVING AN INVERTED CONICAL BASE STRUCTURE

CROSS REFERENCE TO RELATED APPLICATIONS

This application claims priority to Chinese Patent Application No. 201821544161.7, filed on Sep. 20, 2018, the entire contents of which are incorporated herein by reference.

TECHNICAL FIELD

The present application refers to the field of sensors, and in particular to a piezoelectric sensor.

BACKGROUND

The troops, camps, and key security areas require guards to stand guard. However, due to insufficient auxiliary equipment, the guards cannot respond to the surrounding intrusion hazards in the first time, especially in the dark or rainy and snowy weather. If there is an intrusion hazard, the guards cannot guarantee their own safety and cannot guarantee the safety of the security area without sufficient reaction time.

Therefore, auxiliary equipment needs to be set up in the sentry that the guards stand, so as to help the guards sense the intrusion hazard at the first time and even provide a higher level of security measures. The piezoelectric sensing element of the piezoelectric sensor can convert the mechanical energy into electrical energy after being stressed, so the piezoelectric sensor can be placed in the sentry that the guards stand, thereby helping them sense the intrusion hazard at the first time.

There is an existing piezoelectric sensor comprising a base, a piezoelectric sensitive component, a mass block, etc., wherein the base is cylindrical. Only this type of sensor can be placed on the ground to measure ground vibration. When the sensor is fixed on the ground, it must be fixedly mounted by other tools, and the process of fixing the sensor is complicated and takes a long time. Moreover, its low-frequency response sensitivity is also poor since the base is located on the ground surface.

SUMMARY

The main objective of the present application is to provide a piezoelectric sensor to solve the problem that the process of installing the piezoelectric sensor of the prior art on the ground is complicated and its low-frequency response sensitivity is poor.

In order to achieve the above objective, the present application provides a piezoelectric sensor, comprising a base member, having an inverted conical structure at one end; a piezoelectric sensing element, disposed at the other end of the base member; a mass block, disposed on the piezoelectric sensing element; a charge amplifier, disposed above the mass block and electrically connected to the piezoelectric sensing element.

Further, the base member comprises an connection seat; a support, disposed at one end of the connection seat and mounted with the piezoelectric sensing element; a fixed base, disposed at the other end of the connection seat and being the inverted conical structure; and the inverted conical structure gradually decreases in outer diameter from one end close to the connection seat toward the other end away from the connection seat.

Further, the support includes a base body, and a projecting post extending from the base body to a direction away from the connection seat; the piezoelectric sensing element is sleeved on the projecting post, and the mass block is sleeved on the piezoelectric sensing element.

Further, the projecting post is located at a central position of the seat body.

Further, the mass block is made of tungsten-copper alloy.

Further, the piezoelectric sensor comprises an insulating sheet disposed between the connection seat and the support.

Further, the piezoelectric sensor comprises a first cover arranged to cover one end of the connection seat away from the fixed base; the support, the piezoelectric sensing element, the mass block and the charge amplifier are all located inside the first cover.

Further, the first cover is in a form of a cylinder, and two ends of the cylinder are respectively provided with openings, and the opening away from one end of the fixed base is provided with a cover plate, and the outer circumference of the cover plate is connected to the outer peripheral wall of the first cover.

Further, the piezoelectric sensor comprises a second cover located inside the first cover; the support, the piezoelectric sensing element, the mass block and the charge amplifier are all located inside the second cover.

Further, the connection seat includes a large diameter section connected to the fixed base, and a small diameter section fixedly connected to one end of the large diameter section away from the fixed seat and provided with the support; and an outer diameter of the large diameter section is larger than that of the small diameter section; the first cover is arranged to cover the small diameter section at outside and is fixedly connected to an end face of the large diameter section.

The technical solution of the present application has the following advantages.

1. The piezoelectric sensor provided in the present application comprises: a base member, having an inverted conical structure at one end; a piezoelectric sensing element, disposed at the other end of the base member; a mass block, disposed on the piezoelectric sensing element; a charge amplifier, disposed above the mass block and electrically connected to the piezoelectric sensing element. In the actual use process, the base member is inserted into the ground. When the ground generates vibration, the base member and the ground will move at the same acceleration, and the piezoelectric sensing element is subjected to the inertial force of the mass block, thus generating electric charges on the two surfaces of the piezoelectric sensing element, and then the electric signal is amplified by the charge amplifier, i.e., the electric charge can be measured by other measuring instruments, and the ground vibration can be sensed. The base member of the piezoelectric sensor may be quickly inserted into the ground because of its inverted conical structure, and since the base member is placed under the ground, the piezoelectric sensor has higher low-frequency response sensitivity than the piezoelectric sensor placed on the ground.

2. In the piezoelectric sensor provided in the present application, the base member comprises an connection seat; a support, disposed at one end of the connection seat and mounted with the piezoelectric sensing element; a fixed base, disposed at the other end of the connection seat and being the inverted conical structure; and the inverted conical structure gradually decreases in outer diameter from one end close to the connection seat toward the other end away from the connection seat. The connection seat is disposed to facilitate that the support is connected with the fixed base through the connection seat. The fixed base of the inverted conical structure is disposed to facilitate the quick installation of the piezoelectric sensor on the ground, and the installation method is relatively simple, and it is beneficial to improve the low-frequency response sensitivity of the sensor.

3. In the piezoelectric sensor provided in the present application, the support includes a base body, and a projecting post extending from the base body to a direction away from the connection seat; the piezoelectric sensing element is sleeved on the projecting post, and the mass block is sleeved on the piezoelectric sensing element. In this assembly method, there is no need to use the auxiliary structure to fix the components of each part, and the piezoelectric sensing element and the mass block are assembled only by means of sleeving. Therefore, the assembly process is simple, and the sensor may be applied to mass production.

4. In the piezoelectric sensor provided in the present application, the mass block is made of tungsten-copper alloy. Tungsten-copper alloy has a relatively large density, such that the mass block made of tungsten-copper alloy is heavier than the mass block of other materials having the same volume, which may also improve the low-frequency response sensitivity of the piezoelectric sensor.

5. The piezoelectric sensor provided in the present application further comprises a first cover arranged to cover one end of the connection seat away from the fixed base; the support, the piezoelectric sensing element, the mass block and the charge amplifier are all located inside the first cover. The first cover has a function of protecting internal components and shielding external interference, thereby improving the anti-interference ability of the piezoelectric sensor.

6. The piezoelectric sensor provided in the present application further comprises a second cover located inside the first cover; the support, the piezoelectric sensing element, the mass block and the charge amplifier are all located inside the second cover. The second cover is disposed to further improve the anti-interference ability of the piezoelectric sensor.

BRIEF DESCRIPTION OF THE DRAWING

One or more embodiments are illustrated by way of example, and not by limitation, in the figures of the accompanying drawings, wherein elements having the same reference numeral designations represent like elements throughout. The drawings are not to scale, unless otherwise disclosed.

In order to more clearly illustrate the technical solutions of the embodiments of the present application or the prior art, the drawings used in the embodiments of the present application or the prior art will be briefly described below. Obviously, the drawings in the following description are only some embodiments of the present application, and those skilled in the art can obtain other drawings based on these drawings without any creative efforts.

In the drawings, the reference numerals are.

11-connection seat; 111-large diameter section; 112-small diameter section; 12-support; 121-basebody; 122-projecting post; 13-fixed base; 20-piezoelectric sensitive element; 30-mass block; 40-charge amplifier; 50-insulating sheet; 60-first cover; 70-cover plate; 80-second cover

DETAILED DESCRIPTION

The technical solutions of the present application will be described clearly and completely with reference to the accompanying drawings. It is obvious that the described embodiments are only a part of the embodiments of the present application, and not all of the embodiments. All other embodiments obtained by those skilled in the art based on the embodiments of the present application without any creative efforts are within the scope of the present application.

Figure 1:
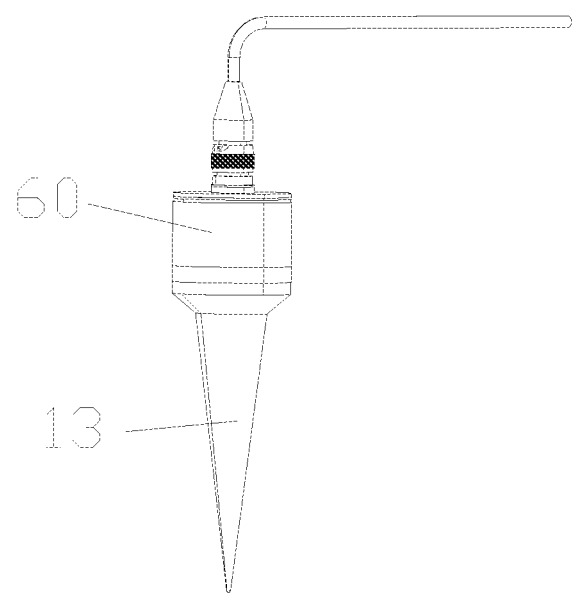
FIG. 1 is a schematic view showing the entire structure of a piezoelectric sensor according to embodiment 1 of the present application.
Figure 2:
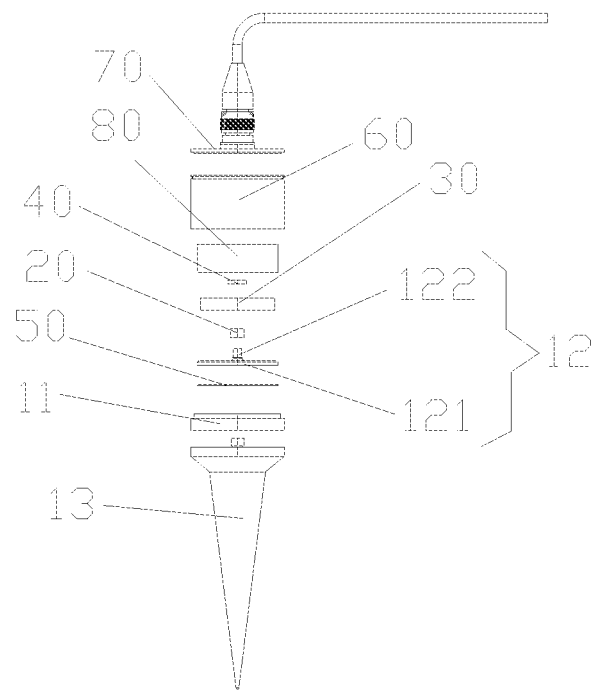
FIG. 2 is an exploded schematic view showing the piezoelectric sensor of FIG. 1.
Figure 3:
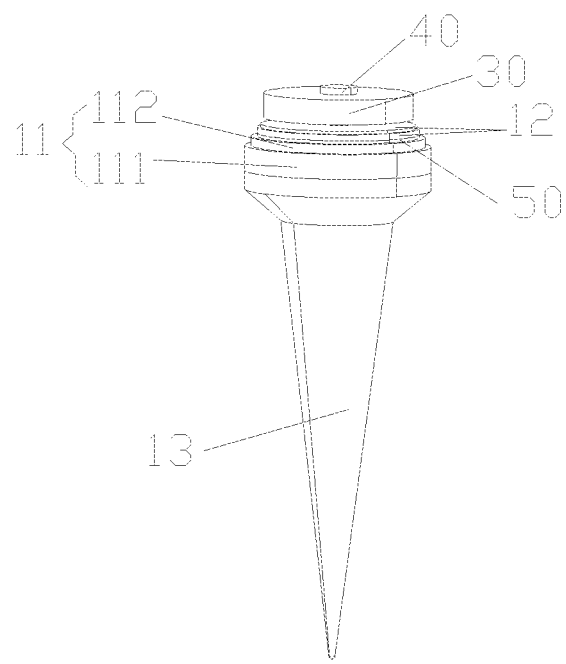
FIG. 3 is a schematic view showing the structure of the piezoelectric sensor of FIG. 1 after removing the first cover and the second cover.

As shown in FIG. 1, FIG. 2 and FIG. 3, the embodiment provides a piezoelectric sensor, comprising a base member, a piezoelectric sensing element 20, a mass block 30 and a charge amplifier 40.

The base member has an inverted conical structure at one end.

The piezoelectric sensing element 20 is disposed at the other end of the base member.

The mass block 30 is disposed on the piezoelectric sensing element 20.

The charge amplifier 40 is disposed above the mass block 30 and electrically connected to the piezoelectric sensing element 20.

In actual use, the base member is inserted into the ground. When the ground generates vibration, the base member and the ground will move at the same acceleration, and the piezoelectric sensing element 20 is subjected to the inertial force of the mass block 30, thus generating electric charges on the two surfaces of the piezoelectric sensing element 20, and then the electric signal is amplified by the charge amplifier 40, i.e., the electric charge can be measured by other measuring instruments, and the ground vibration can be sensed. The base member of the piezoelectric sensor may be quickly inserted into the ground because of its inverted conical structure, and since the base member is placed under the ground, the piezoelectric sensor has higher low-frequency response sensitivity than the piezoelectric sensor placed on the ground.

In the embodiment, the base member comprises: an connection seat 11; a support 12, disposed at one end of the connection seat 11 and mounted with the piezoelectric sensing element 20; a fixed base 13, disposed at the other end of the connection seat 11 and being the inverted conical structure; and the inverted conical structure gradually decreases in outer diameter from one end close to the connection seat 11 toward the other end away from the connection seat 11. The connection seat 11 is disposed to facilitate that the support 12 is connected with the fixed base 12 through the connection seat 11. The fixed base 13 of the inverted conical structure is disposed to facilitate the quick installation of the piezoelectric sensor on the ground, and the installation method is relatively simple, and it is beneficial to improve the low-frequency response sensitivity of the sensor.

As shown in FIG. 2, in the embodiment, the support 12 includes a base body 121, and a projecting post 122 extending from the base body 121 to a direction away from the connection seat 11; the piezoelectric sensing element 20 is sleeved on the projecting post 122, and the mass block 30 is sleeved on the piezoelectric sensing element 20. In this assembly method, it is not required the auxiliary structure to fix the components of each part, and the piezoelectric sensing element 20 and the mass block 30 are assembled only by means of sleeving. Therefore, the assembly process is simple, and the sensor may be applied to mass production.

In the embodiment, the projecting post 122 is located at a central position of the seat body 121.

The mass block 30 is made of tungsten-copper alloy. Tungsten-copper alloy has a relatively large density, such that the mass block 30 made of tungsten-copper alloy is heavier than the mass block 30 of other materials having the same volume, which may also improve the low-frequency response sensitivity of the piezoelectric sensor.

The piezoelectric sensor provided in the embodiment further comprises an insulating sheet 50 disposed between the connection seat 11 and the support 12. The insulating sheet 50 is a layer of sheet, which has the same shape as the base body 121 of the support 12, and may be directly fixed between the connection seat 11 and the support 12. There is no need to use other materials to fix the insulating sheet 50, so as to achieve a simple assembly process.

The piezoelectric sensor provided in the embodiment further comprises a first cover 60 arranged to cover one end of the connection seat 11 away from the fixed base 13; the support 12, the piezoelectric sensing element 20, the mass block 30 and the charge amplifier 40 are all located inside the first cover 60. The first cover 60 has the function of protecting internal components and shielding external interference, thereby improving the anti-interference ability of the piezoelectric sensor.

In the embodiment, the first cover 60 is in a form of a cylinder, and two ends of the cylinder are respectively provided with openings, and the opening away from one end of the fixed base 13 is provided with a cover plate 70, and the outer circumference of the cover plate 70 is connected to the outer peripheral wall of the first cover 60. The cover plate 70 and the first cover 60 together form an enclosed space that protects the components inside the first cover 60.

The piezoelectric sensor provided in the embodiment further comprises a second cover 80 located inside the first cover 60; the support 12, the piezoelectric sensing element 20, the mass block 30 and the charge amplifier 40 are all located inside the second cover 80. The second cover 80 is disposed to further improve the anti-interference ability of the piezoelectric sensor.

As shown in FIG. 3, in the embodiment, the connection seat 11 includes a large diameter section 111 connected to the fixed base 13, and a small diameter section 112 fixedly connected to one end of the large diameter section 111 away from the fixed seat 13 and provided with the support 12; and an outer diameter of the large diameter section 111 is larger than that of the small diameter section 112; the first cover 60 is arranged to cover the small diameter section 112 at outside and is fixedly connected to an end face of the large diameter section 111. The large diameter section 111 and the small diameter section 112 are disposed to facilitate that the fixed base 13 is connected with the support 12 through the connection seat 11.

In the embodiment, the piezoelectric sensing element 20 is a piezoelectric ceramic.

It is apparent that the above embodiments are merely embodiments for clarity of illustration, and are not intended to limit the embodiments. Other variations or modifications of the various forms may be made by those skilled in the art in view of the above description. There is no need and no way to present all of the embodiments. The obvious variations or modifications derived therefrom are still within the scope of protection created by the present application.

What is claimed is:

1. A piezoelectric sensor, comprising:
 a base member, having an inverted conical structure at one end;
 a piezoelectric sensing element, disposed at the other end of the base member;
 a mass block, disposed on the piezoelectric sensing element;
 a charge amplifier, disposed above the mass block and electrically connected to the piezoelectric sensing element,
 wherein, the base member comprises:
  a connection seat;
  a support, disposed at one end of the connection seat and mounted with the piezoelectric sensing element;
  a fixed base, disposed at the other end of the connection seat and being the inverted conical structure; and
  the inverted conical structure gradually decreases in outer diameter from one end close to the connection seat toward the other end away from the connection seat, and
 wherein, the support includes a base body, and a projecting post extending from the base body to a direction away from the connection seat, and
 the piezoelectric sensing element is sleeved on the projecting post, and the mass block is sleeved on the piezoelectric sensing element.

2. The piezoelectric sensor according to claim 1, wherein, the projecting post is located at a central position of the base body.

3. The piezoelectric sensor according to claim 1, wherein, the mass block is made of tungsten-copper alloy.

4. The piezoelectric sensor according to claim 1, further comprising an insulating sheet disposed between the connection seat and the support.

5. The piezoelectric sensor according to claim 1, further comprising a first cover arranged to cover one end of the connection seat away from the fixed base;
 the support, the piezoelectric sensing element, the mass block and the charge amplifier are all located inside the first cover.

6. The piezoelectric sensor according to claim 5, wherein, the first cover is in a form of a cylinder, and two ends of the cylinder are respectively provided with openings, and the opening away from one end of the fixed base is provided with a cover plate, and an outer circumference of the cover plate is connected to an outer peripheral wall of the first cover.

7. The piezoelectric sensor according to claim 5, wherein, the piezoelectric sensor further comprises a second cover located inside the first cover;
 the support, the piezoelectric sensing element, the mass block and the charge amplifier are all located inside the second cover.

8. The piezoelectric sensor according to claim 5, wherein, the connection seat includes a large diameter section connected to the fixed base, and a small diameter section fixedly connected to one end of the large diameter section away from the fixed base and provided with the support; and
 an outer diameter of the large diameter section is larger than that of the small diameter section;

the first cover is arranged to cover the small diameter section at outside and is fixedly connected to an end face of the large diameter section.

\* \* \* \* \*